United States Patent [19]

Armitage

[11] 4,356,458
[45] Oct. 26, 1982

[54] AUTOMATIC IMPEDANCE MATCHING APPARATUS

[75] Inventor: David Armitage, Bangor, England
[73] Assignee: Harry H. LeVeen, Charleston, S.C.
[21] Appl. No.: 297,725
[22] Filed: Aug. 31, 1981
[51] Int. Cl.³ .............................................. H03H 7/40
[52] U.S. Cl. .................................. 333/17 M; 307/270
[58] Field of Search ............. 333/17 M; 455/123, 125; 343/861, 862

[56] References Cited

U.S. PATENT DOCUMENTS 3,601,717 8/1971 Kuecken ......................... 333/17 M
4,234,960 11/1980 Spilsbury et al. .................... 455/123

Primary Examiner—Paul L. Gensler
Attorney, Agent, or Firm—Brooks, Haidt, Haffner & Delahunty

[57] ABSTRACT

Automatic impedance matching apparatus in which a matching unit is connected between a radio frequency source and a load and which comprises variable capacitors and inductor, the capacitors being varied by stepping motors to match the impedance presented to the source to the impedance of the source. The stepping motors are controlled by a circuit which generates trains of pulses corresponding to the forward wave voltage and the reflected wave voltage on a line between the source and the matching unit and provides a train of pulses corresponding to the ratio of the voltages. The pulse rates of trains of pulses corresponding to the ratio, before and after a capacitor is varied, are compared, and the sign of the difference between the pulse rates is used to select a motor and step it in the direction which will cause the variable capacitor connected thereto to change its reactance in a direction which will increase the ratio between the forward and reflected wave voltages.

10 Claims, 5 Drawing Figures

AUTOMATIC IMPEDANCE MATCHING APPARATUS

The invention relates to apparatus for automatically adjusting the impedance of an electrical circuit connected to a radio frequency source so as to maintain the impedance of the circuit at a substantially constant value which will permit the maximum transfer of energy to the load forming part of the circuit, and the invention relates particularly to apparatus for use with the short wave diathermy apparatus described in Armitage U.S. Pat. No. 4,285,346 granted Aug. 25, 1981.

U.S. Pat. No. 4,285,346 describes an impedance matching unit which may be used between a radio frequency generator or source and a pair of electrodes placed adjacent a body. Said application also describes arrangements using a plurality of pairs of electrodes, pairs of which may be rendered separately inoperative by grounding of the transmission cable extending from the matching unit to a pair of electrodes.

It is apparent to those skilled in the art that the impedance presented to the radio frequency generator when it is transmitting energy to a pair of electrodes of diathermy apparatus may vary widely by reason of the positioning of the electrodes with respect to a body and by reason of changes with heating of the part of the body between the electrodes. It is desirable to maintain such impedance relatively constant for power transfer and heating purposes.

There are numerous patents relating to the problem of adjusting to a desired value the impedance presented to a radio frequency source by a load. Examples of such patents are U.S. Pat. Nos. 2,415,799; 2,511,026; 2,745,067; 2,834,887; 3,281,721; 3,794,941 and 3,995,237.

For the reasons given in some of the later patents cited hereinbefore, some of the earlier apparatus for matching a load to a radio frequency source is not entirely satisfactory, particularly at higher frequencies. U.S. Pat. Nos. 3,281,721; 3,794,941 and 3,995,237 suggest measurement of the standing wave ratio for control purposes, but the systems disclosed therein use only the standing wave ratio or additional detectors for control purposes.

One object of the invention is to provide automatic impedance adjusting means which utilizes the forward and reflected standing waves to control the impedance, which does not require other detectors in addition to the standing wave detector and which is substantially entirely digital.

Another object of the invention is to provide relatively simple impedance adjusting apparatus which can adjust the impedance presented to a radio frequency source to a substantially constant value, e.g. 50 ohms, with wide variations in both the resistive and reactive components of the load.

Other objects and advantages of the present invention will be apparent from the following detailed description of the presently preferred embodiments thereof, which description should be considered in conjunction with the accompanying drawings in which:

FIG. 1 is a combined block and circuit diagram illustrating the interconnections of the control circuit of the invention with the apparatus shown in U.S. Pat. No. 4,285,346;

Figure 1:
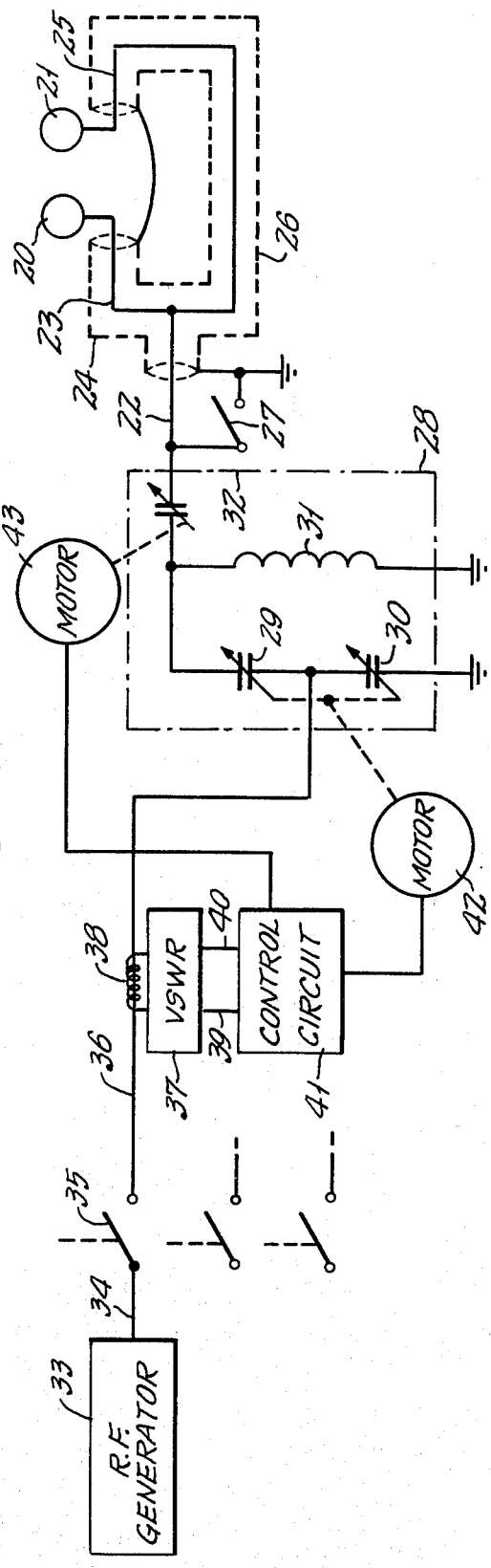

FIG. 1 is a combined block and circuit diagram illustrating the interconnection of the apparatus of the invention with the diathermy apparatus disclosed in U.S. Pat. No. 4,285,346. Although FIG. 1 shows the connection of the apparatus to the circuit of only one pair of electrodes 20 and 21, another pair of the apparatus of the invention is similarly connected to the circuits for the other pairs of electrodes disclosed in U.S. Pat. No. 4,285,346.

As described in said application, electrode 20 is connected to the line 22 by the central conductor 23 of a coaxial cable 24 and the electrode 21 is connected to the line 22 by the central conductor 25 of a coaxial cable 26. A relay operable, grounding switch 27 connects the line 22 to ground as described in U.S. Pat. No. 4,285,346.

The matching unit 28 comprises a pair of ganged variable capacitors 29 and 30, a coil 31 and a variable capacitor 32 connected at one side, to the line 22 and at the other side, to one end of the coil 31.

Radio frequency energy is supplied from the radio frequency generator 33, which may include a power amplifier, to the matching unit 28 by way of a line 34, a switch 35 and a line 36, the switch 35 operating in the same manner as the switch 21 described in U.S. Pat. No. 4,285,346.

The apparatus of the invention comprises a voltage standing wave ratio bridge 37 coupled to the line 36 by the coil or loop 38 and having two output lines 39 and 40, one of which provides a voltage to the control circuit 41 which corresponds to the forward standing wave on the line 36 and the other of which provides a voltage to the control circuit 41 which corresponds to the reflected standing wave on the line 36.

The control circuit 41, which will be described hereinafter in greater detail, controls a pair of stepper motors 42 and 43. The motor 42 is connected to the capacitors 29 and 30 so as to vary the capacitance values of such capacitors 29 and 30 when the shaft of the motor 42 rotates. Similarly, the motor 43 is connected to the capacitor 32 to vary the capacitance value of such capacitor 32.

In the preferred embodiment, the stepper motors 42 and 43 take 200 steps for one revolution. Since the capacitors 29, 30 and 32 change from minimum capacitance to maximum capacitance and then to minimum capacitance in one revolution, each motor steps 100 steps in changing the capacitance of the respective capacitors 29, 30 and 32 from minimum to maximum and vice versa.

The impedance matching apparatus of the invention automatically adjusts itself in order to minimize the power reflected back to the R.F. generator 33 for load impedances which differ from the characteristic impedance of the transmission line, which will be assumed, for example, to be 50 ohms. It is also assumed that the power output of the generator 33 is set up to deliver maximum power into a 50 ohm load. The use of two variable elements, in this case ganged capacitors 29 and 30 and capacitor 32, allows the matching unit 28 two degrees of freedom thereby enabling it to adjust its input impedance to 50 ohms for a wide variation in both the reactive and resistive components of the load.

Figure 2:
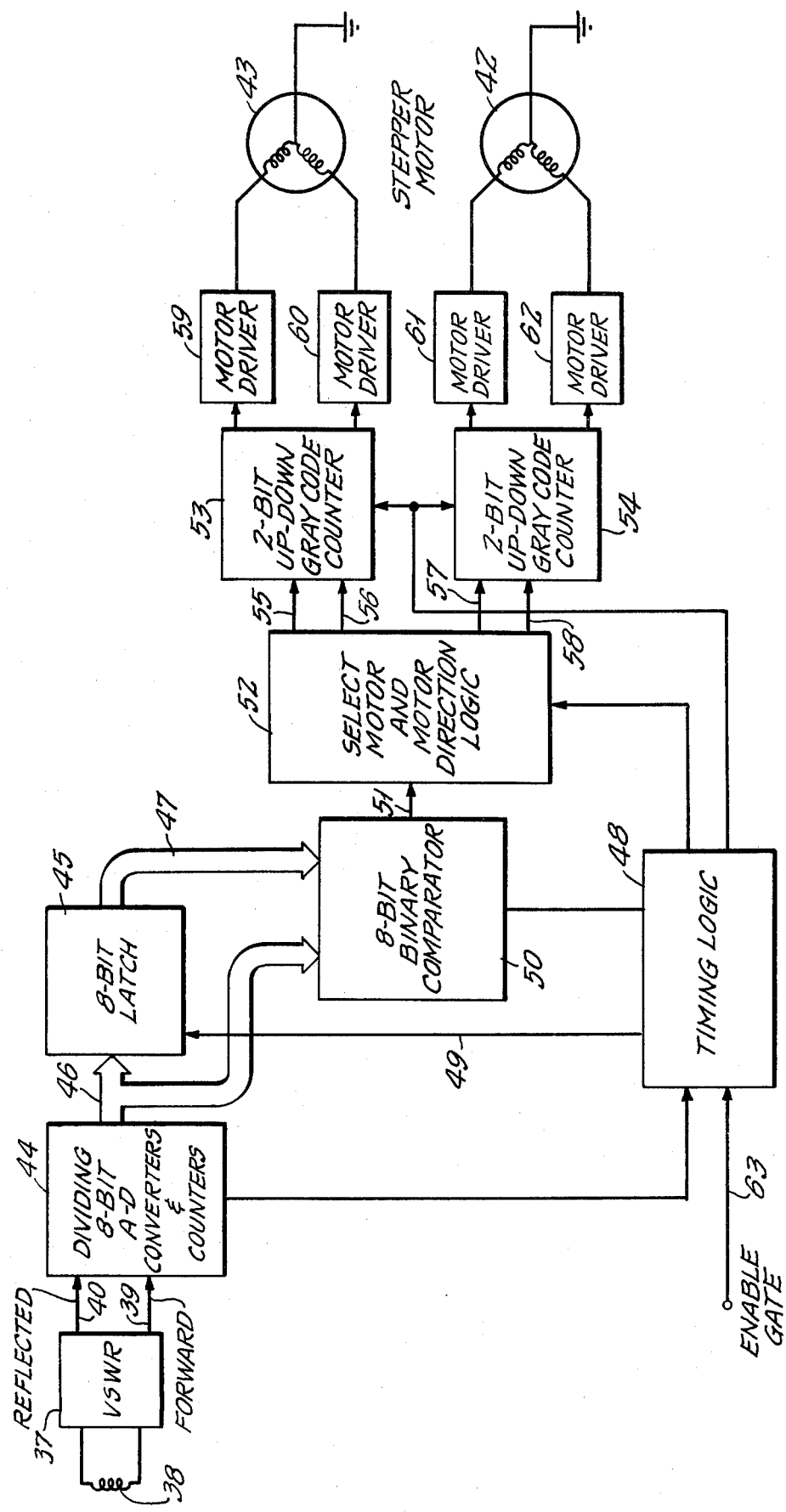
FIG. 2 is a block diagram of the control apparatus of the invention.

The control circuit 41, with the exception of two voltage-to-frequency converters forming a part thereof, is entirely digital, and a block diagram of the preferred form of control circuit 41 is shown in FIG. 2. Voltages corresponding to the forward and reflected voltages are fed by lines 39 and 40 to a dividing, analogue-to-digital converter 44 of the frequency counting type which generates two pulse trains proportional to the forward and reflected voltages. The two pulse trains are separately counted by two counters. After the counter for the "forward voltage" pulse train has counted 256 pulses, the two converters are temporarily inhibited, and the binary number which is then in the counter for the "reflected voltage" pulse train corresponds to the reflected voltage divided by the forward voltage provided that the reflected voltage does not exceed the forward voltage.

The eight-bit latch 45 transfers the eight-bit binary number on the input bus 46 to the output bus 47 when the proper signal is received from the timing logic circuit 48 by way of a line 49. The two eight-bit binary members at the input and the output of the latch 45 correspond, respectively, to the new and previous values of the "degree of mismatch", and such numbers are compared in the eight-bit binary comparator 50. The comparator 50 provides an output on the line 51 which is dependent upon the comparison of the two numbers and which is supplied to the select motor and motor direction logic circuit 52. The circuit 52 provides outputs to the counters 53 and 54 on the lines 55–58 dependent upon the direction of the required adjustment of the impedance matching unit 28, and the counters 53 and 54 supply appropriate pulses to the appropriate stepper motor 42 or 43 by way of driver circuits 59, 60, 61 or 62.

The timing logic circuit 48 is enabled by an enable gate supplied to the circuit by way of line 63. The enable gate may be controlled from a number of sources and may be provided by a circuit responsive to the level of the reflected power, e.g. exceeding two to four watts.

The impedance matching apparatus normally is able to optimize the voltage standing wave ratio (VSWR) within approximately two seconds provided that the starting values of the variable capacitors 29 and 30 and 32 are near to the region of the matched condition, that is to say, a small variation in the value of one of the capacitors corresponding to one step of the stepper motor, causes a detectable change in the VSWR. Since the analogue-to-digital converter 44 employed has eight bits, the smallest detectable change in the reflected voltage is 1/256 th of the value of the forward voltage. Outside this region the apparatus hunts at random, eventually finding itself in a region near to the matched condition. At this point a match is rapidly arrived at. In the matched condition, for a forward power of 500 watts, the reflected power is held typically below 5 watts, corresponding to a VSWR of 1.2.

Figure 3:
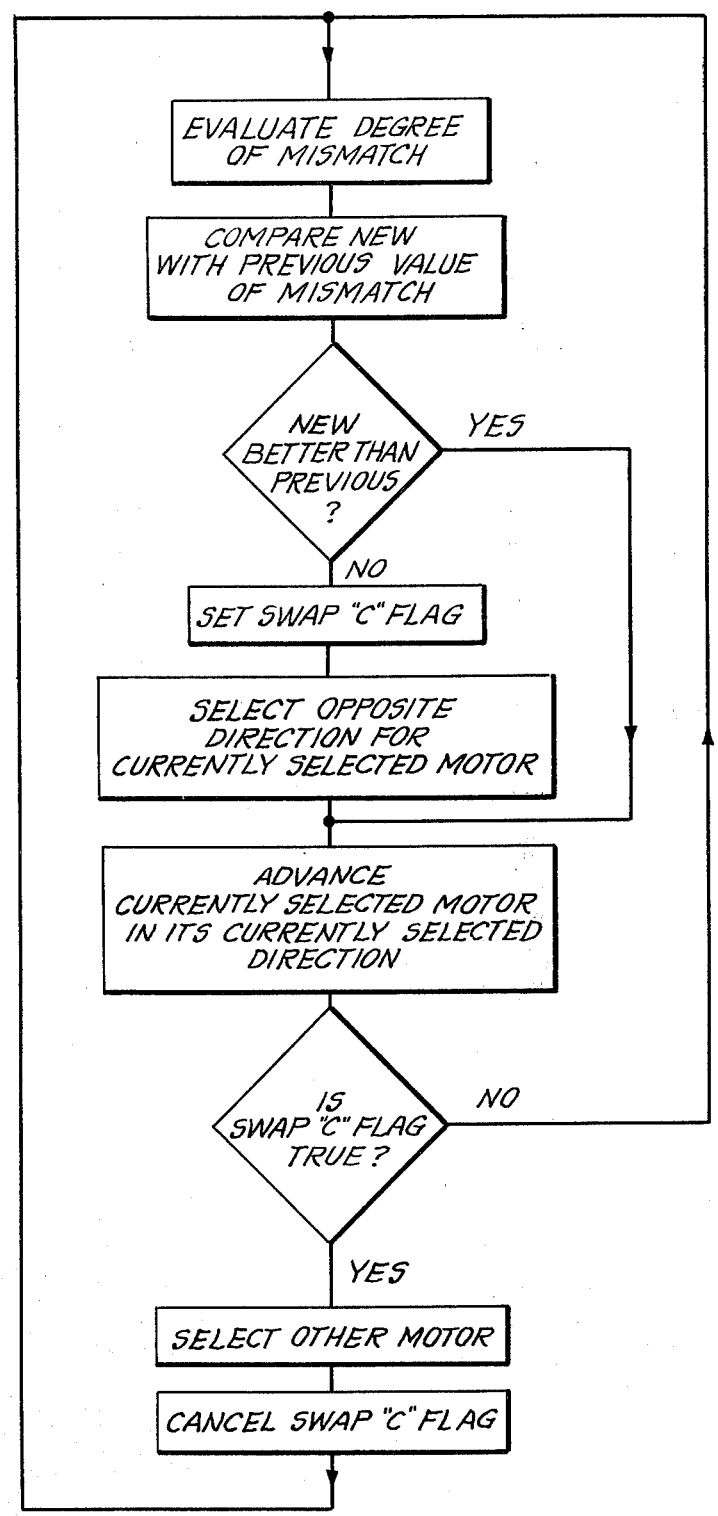
FIG. 3 is a diagram illustrating the algorithm for the control apparatus of the invention.

In operation, the value of the reflected voltage is divided by that of the forward voltage to derive a quantity which represents the degree of mismatch within a wide range of power levels (typically 10 to 600 watts). The matching operation is characterized by the algorithm shown in FIG. 3.

The currently selected motor is advanced one step in its currently selected direction. If this results in an improvement of the VSWR, then, the same motor is again stepped in the same direction. This procedure continues until an advancement of the motor causes a worsening of the VSWR. At this point, the motor direction is reversed, and the motor takes one step backwards. The other motor is then selected, and the same procedure is executed. Eventually the situation arises when no further improvement to the VSWR can be made and the matching apparatus hunts about the matched condition.

Figure 5:
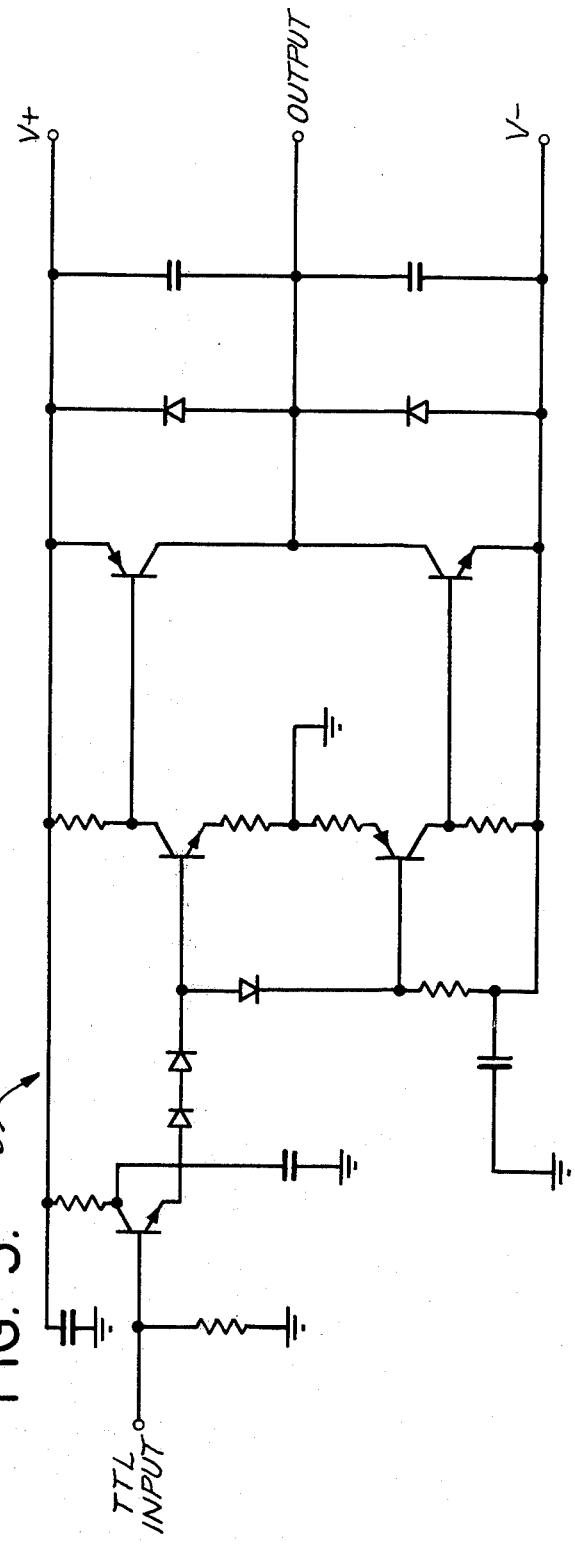
FIG. 5 is a circuit diagram of one form of a stepper motor driver which may be used in the control apparatus of the invention.

It is believed that from the foregoing description, those skilled in the art can provide circuits which will function in the manner described. However, presently preferred circuits for the apparatus, using known components, are illustrated in FIGS. 4 and 5.

Figure 4:
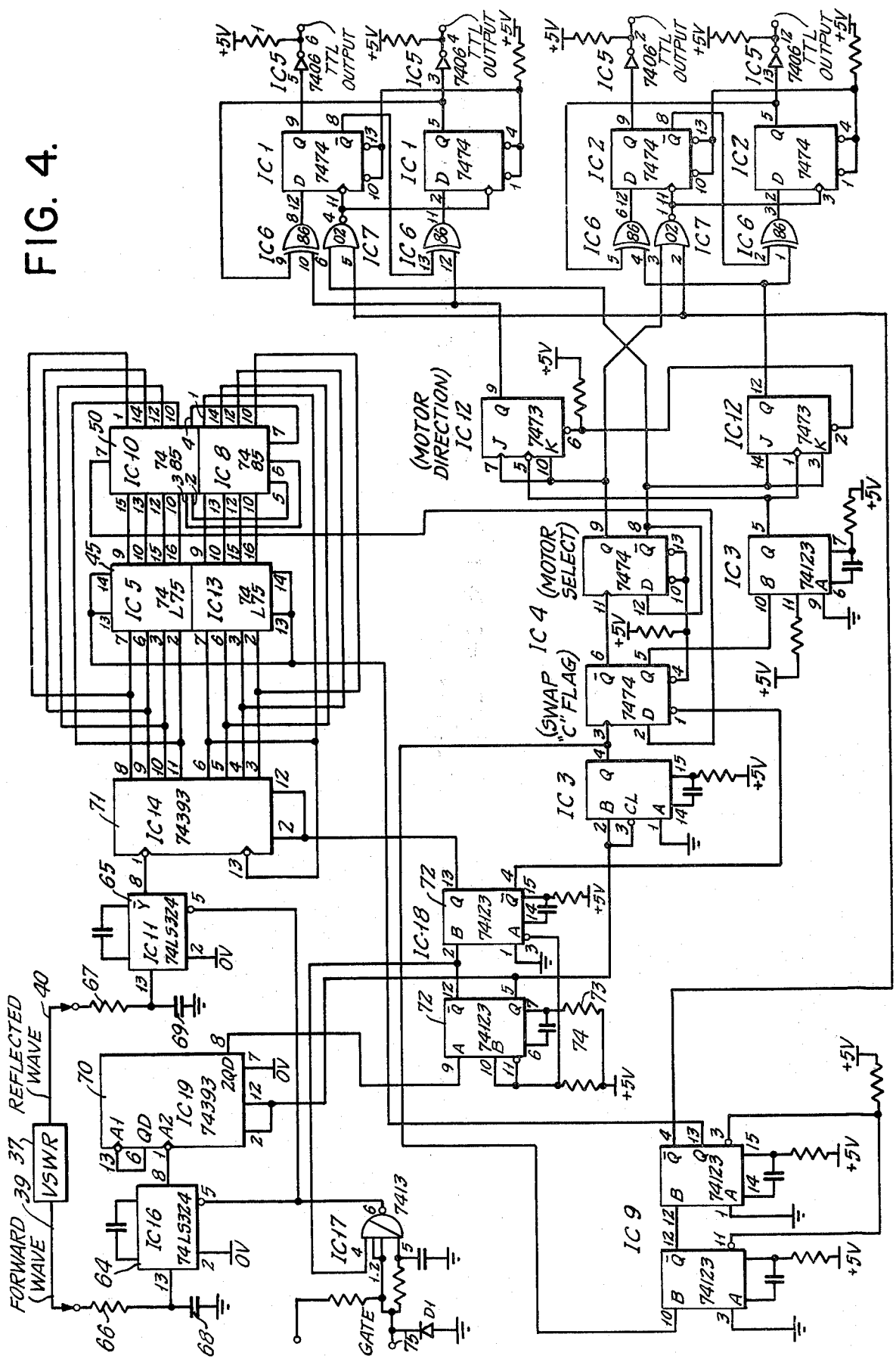
FIG. 4 is a circuit diagram, partly in block form, of one form of circuit which may be used in the control apparatus of the invention.

In the circuit illustrated in FIG. 4, the voltages of the VSWR bridge 37 are fed to two voltage-to-frequency converters 64 and 65 in the form of integrated circuits IC 16 and IC 11. The resistors 66 and 67 and the capacitors 68 and 69 are simple radio frequency filters. The pulse trains from the converters 64 and 65 are fed, respectively, to eight-bit counters 70 and 71 in the form of integrated circuits IC 19 and IC 14.

At the beginning of a cycle, both counters 70 and 71 are in a reset condition. After counter 70 has counted 256 pulses of the "forward voltage" pulse train, the two voltage-to-frequency converters 64 and 65 are temporarily inhibited as a result of the first half of the monostable flip-flop 72 being triggered by the falling edge of the MSB of counter 70, and the binary number which is currently in the counter 71 corresponds to the reflected voltage divided by the forward voltage provided that the reflected voltage does not exceed the forward voltage.

The eight-bit latch 45, comprising the integrated circuits IC 13 and IC 15, transfers the eight-bit number on the input bus to the output bus when a short positive going pulse is applied to pins 13 and 14 of the integrated circuits IC 13 and IC 15. The two eight-bit binary numbers at the input and output of the eight-bit latch 45, corresponding respectively to the new and previous values of the "degree of mismatch", are compared by the comparator 50 comprising the combination of integrated circuits IC 8 and IC 10. A logical 1 appears at pin 7 of circuit IC 10 if the new value is greater than the previous value.

Just after the two voltage-to-frequency converters have been inhibited a positive going edge appears at pin 4 of integrated circuit IC 3. If the new value is greater than the previous (output of the eight-bit binary comparator 50) then, the "swap 'C' flag" is set in integrated circuit IC 4. Otherwise the "swap 'C' flag" remains false. The action of setting the "swap 'C' flag" causes the select motor direction flip-flop (either half of integrated circuit IC 12) to be toggled.

After a period of time, circuit IC 9 times out and the selected up/down Gray code counter, IC 1 or IC 2 is advanced in the currently selected direction. The corresponding stepper motor follows suit. Also, at this point the short positive going pulse generated at pin 13 of circuit IC 9 triggers the eight-bit latch 45.

After a further period of time determined by resistor 73 and capacitor 74, the monostable flip-flop 72 times out and triggers the second monostable flip-flop of IC 18 which in turn delivers a short positive going pulse to the counter 71 which then resets. A short negative going pulse is also sent to circuit IC 4 which cancels the "swap 'C' flag" thus causing a positive going edge at pin 6 of circuit IC 4, which in turn causes the motor select flip-flop to toggle.

Two two-bit up/down Gray code counters are employed comprising integrated circuits IC 1 and IC 2 and their associated logic, integrated circuits IC 6 and IC 7. The direction of count is determined by the sense of the feedback signals at the D inputs of the two D-type flip-flops. A logical 1 at pins 10 and 12 (4 and 1) of the exclusive-OR gate circuit IC 6 causes inversion of the feedback signal. The appropriate counter is enabled by applying a logical 0 to pin 5 (2) of circuit IC 7. The two two-bit numbers are then buffered by circuits IC 5 for presentation to the stepper motor drivers.

Two stepper motor drivers are required for each of the two stepper motors, each motor having two poles. The function of the driver is to convert the TTL levels to the +/−30 volts at 0.15 amps required by each pole of each stepper motor.

The enable gate input, pin 75 of the control board, is normally held at logical 1. Setting this input to logical 0 causes the matching apparatus to pause. Returning the input to logical 1 causes impedance matching to continue after a short delay, the purpose of which is to allow the radio frequency generator 33 and VSWR bridge 37 time to stabilize prior to the monitoring of the output of the VSWR bridge 37 by the matching apparatus. The two-pole stepper motors 42 and 43 operate by changing the state of the positive or negative d.c. voltages at the two pole terminals with respect to the common terminal. The four possibilities for each motor are: ++, +−, −− and −+. In fact, if the motors were subjected to this particular sequence, it would rotate in one direction, one step at a time. If, however, the following sequence were used: ++, −+, −−, +−, . . . then the motor would rotate in the other direction. This is standard operation of a two pole stepper motor. If the sequences represented in + and − are translated into 1 and 0 then the two sequences become:

| | |
|---|---|
| 1 1 | 1 1 |
| 1 0 | 0 1 |
| 0 0 | 0 0 |
| 0 1 | 1 0 |
| 1 1 | 1 1 |
| 1 0 | 0 1 |
| . . | . . |
| . . | . . |
| . . | . . |
| . . | . . |

The two sequences are Gray codes.

As mentioned hereinbefore, two stepper motor drivers are required for each of the motors 42 and 43, e.g. drivers 59 and 60 for the motor 43 and drivers 61 and 62 for the motor 42. Each of the drivers 59-62 may be the same, and although other driver circuits may be used, FIG. 5 illustrates a presently preferred driver circuit 59. The voltage levels applied to the terminal labeled "TTL input" in FIG. 5 by the Gray code counters are converted, in an obvious manner, by the circuit shown in FIG. 5 to the plus and minus thirty volts at 0.15 amperes required by each pole of the stepper motor described hereinbefore.

Although a preferred form of matching unit 28 has been disclosed, it will be apparent that other known forms of matching units may be used, the stepping motors 42 and 43 being used to vary the variable reactances of such other matching units.

Although preferred embodiments of the present invention have been described and illustrated, it will be apparent to those skilled in the art that various modifications may be made without departing from the principles of the invention.

I claim:

1. Automatic impedance matching apparatus comprising:
    a matching unit comprising at least two reactors each of which has reactance varying means for varying the reactance thereof;
    standing wave means for detecting and providing output signals corresponding respectively to the forward wave and to the reflected wave on a transmission line connected to said matching unit;
    converting means connected to said standing wave means for converting said signals into digital output corresponding to the ratio of the reflected wave to the forward wave;
    a pair of stepping motors, one motor being connected to the varying means of one of said reactors for controlling the reactance of the latter and the other motor being connected to the varying means of the other of said reactors for varying the reactance of the latter; and
    control means connected to said motors for selecting a motor to be stepped and for stepping the selected motor in a direction which will change the impedance of said matching unit to a desired value, said control means comprising:
    comparing means connected to said converting means for comparing the digital output obtained before stepping of a motor with the digital output obtained after the stepping of a motor and for providing an output signal; and
    selection means connected to said motors and to said comparing means and responsive to said last-mentioned output signal to select a motor to be stepped and for stepping the selected motor in the direction which will change the reactance of the reactor connected to the selected motor to a desired value.

2. Automatic impedance matching apparatus as set forth in claim 1 wherein said converting means comprises a first converter for providing a first train of pulses corresponding to said forward wave, a second converter for providing a second train of pulses corresponding to said reflected wave, a first counter connected to said first converter for counting the pulses in said first train of pulses, a second counter connected to said second converter for counting the pulses in said second train of pulses and for providing said digital output, and inhibiting means connected to said first counter and to said first and said second converters and operable by said first counter when a predetermined count of pulses is reached to temporarily prevent both converters from providing further trains of pulses whereby the digital output of said second counter represents said ratio of the reflected wave to said forward wave.

3. Automatic impedance matching apparatus as set forth in claim 2 wherein said comparing means comprises latch means having an input and an output and having its input connected to said second counter for transferring the digital output of said second counter to the output of said latch means and a comparator connected to the input and to the output of said latch means for comparing the digital output of said second counter with the digital output at the output of said latch means and for providing a further digital output dependent upon the comparison of the digital output of said second counter and said digital output at the output of said latch means.

4. Automatic impedance matching apparatus as set forth in claim 3 wherein said selection means comprises selector means connected to said comparator and responsive to said further digital output for selecting the motor to be stepped and motor direction and stepping means connected to said selector means and responsive to the output of the selector means for stepping the selected motor.

5. Automatic impedance matching apparatus as set forth in claims 1, 2, 3 or 4 wherein said matching unit has an input and an output and further comprises an inductor and wherein said reactors are variable capacitors, said inductor and one of said capacitors being connected in parallel with said input of said matching unit and the other of said capacitors being connected in series between one end of said inductor and said output of said matching unit.

6. Radio frequency heating apparatus comprising:
a pair of electrodes;
a radio frequency generator having an output;
a matching unit comprising at least two reactors each of which has reactance varying means for varying the reactance thereof;
means connecting said matching unit to said electrodes;
means including a transmission line connecting said matching unit to said output of said generator;
standing wave means coupled to said transmission line for detecting and providing output signals corresponding respectively to the forward wave and to the reflected wave on said transmission line;
converting means connected to said standing wave means for converting said signals into digital output corresponding to the ratio of the reflected wave to the forward wave;
a pair of stepping motors, one motor being connected to the varying means of one of said reactors for controlling the reactance of the latter and the other motor being connected to the varying means of the other of said reactors for varying the reactance of the latter; and
control means connected to said motors for selecting a motor to be stepped and for stepping the selected motor in a direction which will change the impedance of said matching unit to a desired value, said control means comprising:
comparing means connected to said converting means for comparing the digital output obtained before stepping of a motor with the digital output obtained after the stepping of a motor and for providing an output signal; and
selection means connected to said motors and to said comparing means and responsive to said last-mentioned output signal to select a motor to be stepped and for stepping the selected motor in the direction which will change the reactance of the reactor connected to the selected motor to a value which will present an impedance to said generator substantially equal to the impedance of said output of said generator.

7. Radio frequency heating apparatus as set forth in claim 6 wherein said converting means comprises a first converter for providing a first train of pulses corresponding to said forward wave, a second converter for providing a second train of pulses corresponding to said reflected wave, a first counter connected to said first converter for counting the pulses in said first train of pulses, a second counter connected to said second converter for counting the pulses in said second train of pulses and for providing said digital output, and inhibiting means connected to said first counter and to said first and said second converters and operable by said first counter when a predetermined count of pulses is reached to temporarily prevent both converters from providing further trains of pulses whereby the digital output of said second counter represents said ratio of the reflected wave to said forward wave.

8. Radio frequency heating apparatus as set forth in claim 7 wherein said comparing means comprises latch means having an input and an output and having its input connected to said second counter for transferring the digital output of said second counter to the output of said latch means and a comparator connected to the input and to the output of said latch means for comparing the digital output of said second counter with the digital output at the output of said latch means and for providing a further digital output dependent upon the comparison of the digital output of said second counter and said digital output at the output of said latch means.

9. Radio frequency heating apparatus as set forth in claim 8 wherein said selection means comprises selector means connected to said comparator and responsive to said further digital output for selecting the motor to be stepped and motor direction and stepping means connected to said selector means and responsive to the output of the selector means for stepping the selected motor.

10. Radio frequency heating apparatus as set forth in claims 6, 7, 8 or 9 wherein said matching unit has an input connected to said transmission line and an output, said means connecting said matching unit to said electrodes connecting the output of said matching unit to said electrodes, wherein said matching unit further comprises an inductor and wherein said reactors are variable capacitors, said inductor and one of said capacitors being connected in parallel with said input of said matching unit and the other of said capacitors being connected in series between one end of said inductor and said output of said matching unit.

* * * * *